(12) United States Patent
Matsuo et al.

(10) Patent No.: US 8,624,156 B2
(45) Date of Patent: *Jan. 7, 2014

(54) MANUFACTURING METHOD OF LASER PROCESSED PARTS AND PROTECTIVE SHEET FOR LASER PROCESSING

(75) Inventors: Naoyuki Matsuo, Ibaraki (JP); Masakatsu Urairi, Ibaraki (JP); Atsushi Hino, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 1773 days.

This patent is subject to a terminal disclaimer.

(21) Appl. No.: 11/331,674

(22) Filed: Jan. 13, 2006

(65) Prior Publication Data

US 2006/0228650 A1    Oct. 12, 2006

(30) Foreign Application Priority Data

Jan. 14, 2005    (JP) .................................. 2005-007370

(51) Int. Cl.
*B23K 26/00* (2006.01)

(52) U.S. Cl.
USPC .................................. 219/121.71; 219/121.6

(58) Field of Classification Search
USPC ............. 219/121.6, 121.67, 121.68; 156/247; 438/464
See application file for complete search history.

(56) References Cited

U.S. PATENT DOCUMENTS

| | | | |
|---|---|---|---|
| 5,169,678 A | 12/1992 | Cole et al. | |
| 5,271,946 A * | 12/1993 | Hettche | 424/490 |
| 5,278,199 A | 1/1994 | Ohkawa et al. | |
| 5,460,921 A | 10/1995 | Cywar et al. | |
| 5,493,096 A | 2/1996 | Koh | |
| 5,523,266 A * | 6/1996 | Nishimura et al. | 501/54 |
| 5,538,789 A | 7/1996 | Capote et al. | |
| 5,981,145 A | 11/1999 | Ding et al. | |
| 6,255,405 B1 | 7/2001 | Kang et al. | |
| 6,258,426 B1 | 7/2001 | Yamamoto et al. | |
| 6,407,363 B2 | 6/2002 | Dunsky et al. | |
| 6,413,839 B1 | 7/2002 | Brown et al. | |
| 6,444,310 B1 * | 9/2002 | Senoo et al. | 428/354 |
| 6,561,743 B1 | 5/2003 | Nakatsu | |
| 6,596,968 B2 | 7/2003 | Yamamoto et al. | |
| 6,610,960 B2 | 8/2003 | De Steur et al. | |

(Continued)

FOREIGN PATENT DOCUMENTS

| | | |
|---|---|---|
| EP | 0 863 231 A | 9/1998 |
| EP | 0 976 802 | 2/2000 |

(Continued)

OTHER PUBLICATIONS

European Search Report issued on the European Application No. 06 00 0527.9, dated May 10, 2006.

(Continued)

*Primary Examiner* — Henry Yuen
*Assistant Examiner* — Ayub Maye
(74) *Attorney, Agent, or Firm* — Knobbe Martens Olson & Bear LLP

(57) ABSTRACT

Providing a method of manufacturing a laser processed part by using a protective sheet for laser processing capable of effectively suppressing contamination of surface of workpiece by decomposition product, and processing at high precision, when processing the workpiece by optical absorption ablation of laser beam. It is also an object to present a protective sheet for laser processing for use in the manufacturing method of laser processed part.

31 Claims, 3 Drawing Sheets

(56) References Cited

U.S. PATENT DOCUMENTS

| | | | |
|---|---|---|---|
| 6,811,888 B2 | 11/2004 | Hamann et al. | |
| 6,864,459 B2 | 3/2005 | Chang et al. | |
| 7,586,060 B2 | 9/2009 | Urairi et al. | |
| 8,168,030 B2 | 5/2012 | Matsuo et al. | |
| 2001/0015259 A1* | 8/2001 | Toyoda et al. | 156/344 |
| 2002/0090493 A1 | 7/2002 | Kamada et al. | |
| 2002/0104831 A1* | 8/2002 | Chang et al. | 219/121.7 |
| 2002/0127824 A1 | 9/2002 | Shelton et al. | |
| 2003/0108762 A1 | 6/2003 | Hamann et al. | |
| 2003/0207062 A1 | 11/2003 | Herzog et al. | |
| 2003/0226832 A1 | 12/2003 | Liu et al. | |
| 2004/0002199 A1 | 1/2004 | Fukuyo et al. | |
| 2004/0048054 A1 | 3/2004 | Tobita et al. | |
| 2004/0112880 A1 | 6/2004 | Sekiya | |
| 2004/0132294 A1* | 7/2004 | Takagi et al. | 438/689 |
| 2005/0003635 A1* | 1/2005 | Takekoshi | 438/464 |
| 2005/0029238 A1 | 2/2005 | Chen | |
| 2005/0173387 A1 | 8/2005 | Fukuyo et al. | |
| 2005/0181581 A1 | 8/2005 | Fukuyo et al. | |
| 2005/0184037 A1 | 8/2005 | Fukuyo et al. | |
| 2005/0189330 A1 | 9/2005 | Fukuyo et al. | |
| 2005/0194364 A1 | 9/2005 | Fukuyo et al. | |
| 2005/0242073 A1 | 11/2005 | Nakamura et al. | |
| 2006/0040473 A1 | 2/2006 | Fukuyo et al. | |
| 2006/0157191 A1 | 7/2006 | Matsuo et al. | |
| 2006/0160331 A1 | 7/2006 | Fukuyo et al. | |
| 2006/0222813 A1* | 10/2006 | Kato et al. | 428/131 |
| 2006/0246279 A1 | 11/2006 | Urairi et al. | |
| 2007/0181543 A1 | 8/2007 | Urairi et al. | |
| 2010/0273313 A1 | 10/2010 | Urairi et al. | |

FOREIGN PATENT DOCUMENTS

| | | |
|---|---|---|
| EP | 1 634 673 A | 3/2006 |
| JP | 5-330046 | 12/1993 |
| JP | 6-163687 | 6/1994 |
| JP | 6-170822 | 6/1994 |
| JP | 7-168386 | 7/1995 |
| JP | 9-136421 | 5/1997 |
| JP | 09-188854 A | 11/1997 |
| JP | 63-036988 | 2/1998 |
| JP | 2000-104026 | 4/2000 |
| JP | 2001-118862 | 4/2001 |
| JP | 2001-323075 | 11/2001 |
| JP | 2002-105221 | 4/2002 |
| JP | 2002-134921 | 5/2002 |
| JP | 2002-178181 | 6/2002 |
| JP | 2002-239766 | 8/2002 |
| JP | 2002-322438 | 11/2002 |
| JP | 2002-338911 | 11/2002 |
| JP | 2002-343747 | 11/2002 |
| JP | 2002-343747 A | 11/2002 |
| JP | 2002338911 A * | 11/2002 |
| JP | 2003-23230 | 1/2003 |
| JP | 2003-33889 | 2/2003 |
| JP | 2003-34780 A | 2/2003 |
| JP | 2003-113355 | 4/2003 |
| JP | 2003-173988 | 6/2003 |
| JP | 2003-179360 | 6/2003 |
| JP | 2003-211277 | 7/2003 |
| JP | 2004-091547 A | 12/2003 |
| JP | 2004-122182 | 4/2004 |
| JP | 2004-188475 | 7/2004 |
| JP | 2004-230391 | 8/2004 |
| JP | 2004-311848 | 11/2004 |
| JP | 2004-322157 | 11/2004 |
| JP | 2005-186109 | 7/2005 |
| JP | 2005-186110 | 7/2005 |
| JP | 2005-187619 | 7/2005 |
| JP | 2005-279676 | 10/2005 |
| JP | 2005-279680 | 10/2005 |
| JP | 2005-279682 | 10/2005 |
| JP | 2005-279692 | 10/2005 |
| JP | 2005-279696 | 10/2005 |
| JP | 2005-279698 | 10/2005 |
| JP | 2005-279749 | 10/2005 |
| JP | 2005-279752 | 10/2005 |
| JP | 2005-279754 | 10/2005 |
| JP | 2005-279755 | 10/2005 |
| JP | 2005-279757 | 10/2005 |
| JP | 2005-279758 A | 10/2005 |
| JP | 2006-192474 | 7/2006 |
| WO | WO 01/41968 | 6/2001 |
| WO | WO 03/028949 | 4/2003 |
| WO | WO 2004/096483 A | 11/2004 |
| WO | WO 2005/063435 | 7/2005 |

OTHER PUBLICATIONS

International Search Report issued on the related PCT Application No. PCT/JP2004/005554, dated Aug. 10, 2004.
International Search Report issued on the related PCT Application No. PCT/JP2004/016268, dated Feb. 15, 2005.
File History of the related U.S. Appl. No. 10/554,540, as of Oct. 13, 2008.
File History of the related U.S. Appl. No. 11/331,465, as of Oct. 13, 2008.
File History of the related U.S. Appl. No. 10/584,825, as of Oct. 13, 2008.
File History of the related U.S. Appl. No. 10/554,540, for the period of Oct. 14, 2008-Aug. 13, 2009.
File History of the related U.S. Appl. No. 11/331,465, for the period of Oct. 14, 2008-Aug. 13, 2009.
File History of the related U.S. Appl. No. 10/584,825, for the period of Oct. 14, 2008-Aug. 13, 2009.
Japanese Office Action issued on the corresponding Japanese Patent Application No. 2005007370, dated Dec. 22, 2009.
File History of the related U.S. Appl. No. 10/554,540, for the period of Aug. 14, 2009-Jan. 15, 2010.
File History of the related U.S. Appl. No. 11/331,465, for the period of Aug. 14, 2009-Jan. 15, 2010.
File History of the related U.S. Appl. No. 10/584,825, for the period of Aug. 14, 2009-Jan. 15, 2010.
Japanese Office Action issued on the corresponding Japanese Patent Application No. 2005-007370, dated Jul. 1, 2010.
File History of the related U.S. Appl. No. 10/554,540, for the period of Jan. 16, 2010-Apr. 28, 2010.
File History of the related U.S. Appl. No. 11/331,465, for the period of Jan. 16, 2010-Apr. 28, 2010.

* cited by examiner

MANUFACTURING METHOD OF LASER PROCESSED PARTS AND PROTECTIVE SHEET FOR LASER PROCESSING

TECHNICAL FIELD

The invention relates to a manufacturing method of laser processed parts obtained by processing workpieces such as sheet material, circuit board, semiconductor wafer, glass substrate, ceramic substrate, metal substrate, semiconductor laser or other light emitting and light detecting element board, MEMS board, semiconductor package, cloth, leather, paper or the like, by cutting, drilling, marking, grooving, scribing, trimming or other shaping process by ultraviolet absorption ablation by laser beam. The present invention also relates to a protective sheet for laser processing used when processing a workpiece by ultraviolet absorption ablation by laser beam.

BACKGROUND ART

As the electronic and electric appliances are reduced in size recently, component parts are also reduced in size and advanced in definition, and high definition and high precision are demanded in machining of parts at machining precision of +/−50 μm or less. In the conventional press processing or blanking process, the precision is about +/−100 μm at most, and such demand cannot be satisfied. Drilling of materials is also demanded to conform to high definition and high precision, and drilling by using conventional drill or die cannot meet the needs.

To solve the problems, lately, machining of materials by using laser beam is attracting wide attention. In particular, the machining method by ultraviolet absorption ablation of laser beam of small heat damage and high definition is noticed as precise outline processing method or fine drilling method.

As the background art, for example, the dicing method of workpiece includes a method of dicing the workpiece by laser beam while supporting and fixing the workpiece on a dicing sheet (Japanese Laid-open Patent No. 2002-343747). Also proposed is a method of dicing a semiconductor wafer by combining laser with water micro jet (Japanese Laid-open Patent No. 2003-34780). The dicing sheet mentioned in these patent publications is disposed at the exit side of laser beam of the workpiece, and is used for supporting and fixing the workpiece (to be processed by laser) during dicing and in the subsequent processes.

When laser beam is used, it requires aftertreatment called desmearing in order to remove deposits of decomposition products of carbon or the like generated by laser processing from the surface of workpiece. The sticking strength of decomposition products is firm in proportion to power of laser beam, and when the power of laser beam is increased, it is difficult to remove deposits in aftertreatment. A stubborn decomposition product may be generally removed by wet desmearing using an aqueous solution of potassium permanganate or the like, but the wet desmearing is accompanied by heavy environmental burden of such as waste liquid treatment. In particular, at the side contacting with the processing table of workpiece or adhesive sheet (the laser beam exist side) is likely to be coated not only with the decomposition products of workpiece but also with decomposition products of processing table and adhesive sheet. As a result, improvement of throughput of processing is impeded, or reliability of cutting or drilling is lowered.

SUMMARY OF THE INVENTION

An object of the present invention to provide a method of manufacturing a laser processed part by using a protective sheet for laser processing capable of effectively suppressing contamination of surface of workpiece by decomposition product, and processing at high precision, when processing the workpiece by optical absorption ablation of laser beam. It is also an object of the present invention to present a protective sheet for laser processing for use in the manufacturing method of laser processed part.

The present inventors have intensively accumulated studies in order to solve the problems, and have completed the invention by discovering that the objects can be achieved by the manufacturing method of laser processed parts by using the following protective sheet for laser processing (hereafter called protective sheet).

Specifically, the present invention relates to a method of manufacturing a laser processed part using a protective sheet for laser processing having at least an adhesive layer on a base material, with an extinction coefficient ratio of 1 or more, the extinction coefficient ratio being an extinction coefficient of protective sheet for laser processing at wavelength 532 nm divided by an extinction coefficient of a workpiece to be processed at wavelength 532 nm, the method comprising the steps of adhering the adhesive layer of the protective sheet for laser processing to a laser beam incident side of the workpiece; processing the protective sheet for laser processing and the workpiece by irradiating a laser beam; and removing the protective sheet for laser processing from the processed workpiece.

The protective sheet is laminated at the incident side of laser beam of workpiece (laser beam irradiation side) before laser processing of workpiece by ultraviolet absorption ablation of laser beam, and is used for protecting the workpiece surface from decomposition products and scattering matter generated by ablation.

A protective sheet has at least an adhesive layer on a base material. By using an adhesive protective sheet, tightness of interface of protective sheet and workpiece is enhanced, and invasion of decomposition product into interface can be suppressed, and thereby contamination of workpiece surface by decomposition product can be suppressed.

In the manufacturing method of the present invention, it is required to select and use a protective sheet of which extinction coefficient ratio (extinction coefficient of protective sheet for laser processing at wavelength 532 nm/extinction coefficient of workpiece at wavelength 532 nm) is 1 or more. The present inventors found correlation between the extinction coefficient and laser processing performance, and discovered that contamination of surface of workpiece by decomposition product can be effectively suppressed by using the protective sheet of which extinction coefficient ratio is 1 or more.

The extinction coefficient ratio is an important parameter for laser processing of protective sheet and workpiece. The smaller the extinction coefficient of a solid matter at a certain wavelength, the smaller is absorption of light energy. That is, optical absorption in a solid matter occurs in light invasion length (effective distance from solid surface: 1/extinction coefficient), and when extinction coefficient is small, light invasion length is long, and accumulated energy per unit volume is small. Hence, laser processing is difficult in a material of small extinction coefficient.

By using the protective sheet of which extinction coefficient ratio is 1 or more, as in the present invention, invasion length of laser beam in the protective sheet is set shorter than the invasion length of laser beam in the workpiece. Hence, the absorption of light energy in the protective sheet is greater than in the workpiece, and hence laser processing is easier.

By using the protective sheet of which extinction coefficient ratio is 1 or more, contamination of surface of workpiece by decomposition product can be effectively suppressed, of which reason is estimated as follows. A protective sheet of which extinction coefficient ratio is 1 or more has a laser processing property equivalent or more to that of workpiece, and hence it is etched by laser beam same as or earlier than workpiece. Hence, decomposition product of workpiece scatters effectively to outside from the etching portion of protective sheet, and hardly invades into the interface area of protective sheet and workpiece. As a result, contamination of workpiece surface can be effectively suppressed.

Preferably, the extinction coefficient ratio is 1.2 or more, or more preferably 1.5 or more. If the extinction coefficient ratio is less than 1, etching of workpiece proceeds earlier than cutting or piercing of protective sheet. In such a case, there is no scattering route for decomposition product produced by etching of workpiece, and decomposition product may invade into the interface of protective sheet and workpiece, and the surface of workpiece may be contaminated. When the surface of workpiece is contaminated by decomposition product, after laser processing of workpiece, it may be hard to strip peel off the protective sheet from the workpiece, or it may be hard to remove decomposition product in later process, and the processing precision of workpiece tends to decline.

In the manufacturing method of laser processed part of the present invention, preferably, the workpiece is one of a sheet material, a circuit board, a semiconductor wafer, a glass substrate, a ceramic substrate, a metal substrate, a semiconductor laser light emitting or receiving element substrate, an MEMS substrate, and a semiconductor package.

Another aspect of the present invention relates to a method of manufacturing a laser processed part using an protective sheet for laser processing that includes at least an adhesive layer on a base material, and whose extinction coefficient at wavelength 532 nm is 20 cm$^{-1}$ or more, the method comprising the steps of adhering the adhesive layer of the protective sheet for laser processing to a laser beam incident side of a metal material; processing the protective sheet for laser processing and the metal material by irradiating a laser beam; and removing the protective sheet for laser processing from the processed metal material.

When processing a metal material, in particular, it is hard to measure the extinction coefficient of metal material. However, by using a protective sheet of which extinction coefficient at wavelength 532 nm of 20 cm$^{-1}$ or more, contamination of metal material surface by decomposition product can be suppressed effectively. The extinction coefficient at wavelength 532 nm of protective sheet is preferably 30 cm$^{-1}$ or more, or more preferably 50 cm$^{-1}$ or more.

In the other aspect of the present invention, the metal material is one of a semiconductor wafer and a metal substrate.

Preferably, the base material contains an aromatic polymer. Since this material is large in extinction coefficient at wavelength 532 nm, the extinction coefficient ratio at wavelength 532 nm can be adjusted to 1 or more relatively easily.

In the manufacturing method of laser processed part of the present invention, preferably, the processing is cutting or drilling.

The invention relates to the protective sheet for laser processing used in manufacturing method of laser processed parts. The protective sheet is preferably used when manufacturing semiconductor chips, in particular, by dicing a semiconductor wafer.

BEST MODE FOR CARRYING OUT THE INVENTION

Figure 1:
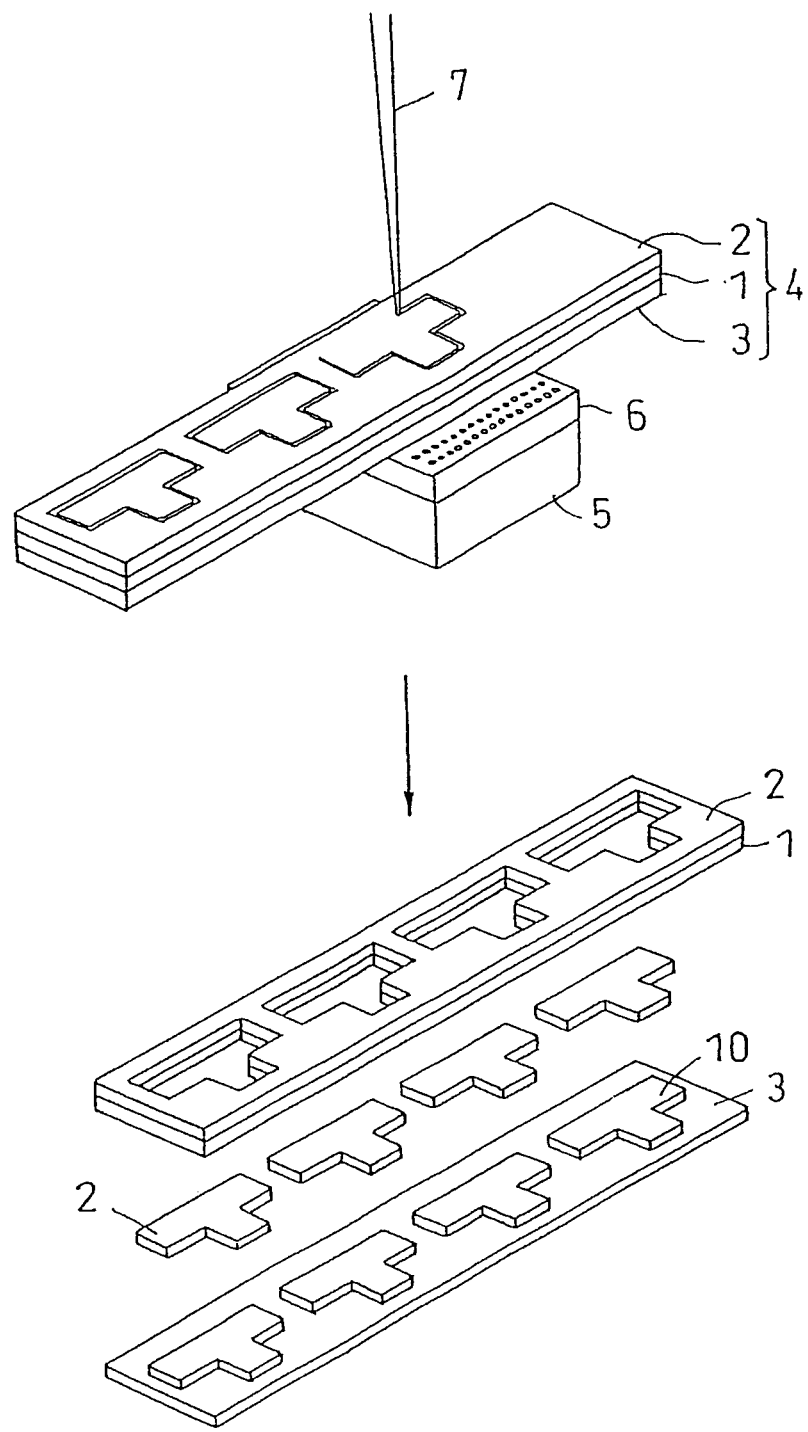
FIG. 1 is a schematic process diagram showing an example of manufacturing method of laser processed parts according to the invention.

As a laser used in the present invention, such a laser is used that emits light at wavelength 532 nm such as Nd:YAG laser second harmonic expected to process at high precision with high throughput by high power output, without worsening the precision or appearance of hole edge or cut section wall of workpiece by thermal damage in laser processing.

The workpiece is not particularly specified as far as it can be processed by ultraviolet absorption ablation of laser beam emitted from the laser, and may include, among others, sheet material, circuit board, semiconductor wafer, glass substrate, ceramic substrate, metal substrate, semiconductor laser or other light emitting or light detecting element board, MEMS (micro electro mechanical system) board, semiconductor package, cloth, leather, and paper.

The protective sheet and manufacturing method of the invention are preferably applied particularly in processing of sheet material, circuit board, semiconductor wafer, glass substrate, ceramic substrate, metal substrate, semiconductor laser light emitting or light detecting element board, MEMS board, and semiconductor package.

Various sheet materials include, for example, macromolecular films and nonwoven cloths made of polyimide resin, polyester resin, epoxy resin, urethane resin, polystyrene resin, polyethylene resin, polyamide resin, polycarbonate resin, silicone resin, fluorine resin, etc., and further sheets made of such resins provided with physical or optical functions by drawing, impregnation or other processes, metal sheets of copper, aluminum, stainless steel, and others, and the macromolecular film and/or metal sheet laminated directly or by way of adhesive or the like.

Examples of the circuit board include one-side, double-side or multi-layer flexible printed board, rigid board of glass epoxy, ceramic or metal core substrate, and optical circuit or opto-electrical mixed circuit board formed on glass or polymer.

Metal materials include both semimetals and alloys, for example, gold, SUS, copper, iron, aluminum, stainless steel, silicon, titanium, nickel, tungsten, and their processed materials (semiconductor wafer, metal board, etc.).

In the manufacturing method of laser processed part of the present invention, a protective sheet having at least an adhesive layer on a base material is used. It is required to select and use a protective sheet of which extinction coefficient ratio is 1 or more. On the other hand, for laser processing of metal material, it is required to select and use a protective sheet of which extinction coefficient at wavelength 532 is 20 cm$^{-1}$ or more.

Forming material of base material includes, for example, polyethylene terephthalate, polyethylene naphthalate, polystyrene, polycarbonate, polyimide, (meth)acrylic polymer, polyurethane, cellulose, silicone rubber, polypropylene and other polyolefin polymer, but is not limited to them alone. Among them, in particular, it is preferred to use material of high extinction coefficient such as polyimide, polyethylene naphthalate, polystyrene, polycarbonate, other aromatic polymer, cellulose, and silicone rubber.

A filler can be added to base material. The filler is a material added for enhancing the extinction coefficient of base material, including, for example, pigment, dyestuff, coloring matter, Au, Cu, Pt, Ag other metal fine particles, metal colloid, carbon, and other inorganic fine particles.

The coloring matter is not particularly specified as far as it can absorb the light of wavelength 532 nm, and the dyestuff includes various types such as basic dye, acid dye, and direct dye. Examples of dyestuff and coloring matter include nitro dye, nitroso dye, stilbene dye, pyrazolone dye, thiazole dye, azo dye, polyazo dye, carbonium dye, quinoanyl dye, indophenol dye, indoaniline dye, indamine dye, quinonimine dye, azine dye, oxidizing dye, oxazine dye, thiazine dye, acryzine dye, diphenyl methane dye, triphenyl methane dye, xanthene dye, thioxanthene dye, sulfurizing dye, pyridine dye, pyridone dye, thiadiazole dye, thiophene dye, benzoin thiazole dye, quinoline dye, indigo dye, thioindigo dye, anthraquinone dye, benzophenone dye, benzoquinone dye, naphthoquinone dye, phthalocyanine dye, cyanine dye, methine dye, polymethine dye, azomethine dye, condensed methine dye, naphthal imide dye, perinone dye, triaryl methane dye, xanthene dye, aminoketone dye, oxyketone dye, and indigoid dye. These dyes may be used either alone or in combination of two or more types.

The dyestuff or coloring matter may be nonlinear optical coloring matter. The nonlinear optical coloring matter is not particularly specified, and known nonlinear optical coloring matters may be used (for example, benzene nonlinear optical coloring matter, stilbene nonlinear optical coloring matter, cyanine nonlinear optical coloring matter, azo nonlinear optical coloring matter, rhodamine nonlinear optical coloring matter, biphenyl nonlinear optical coloring matter, chalcone nonlinear optical coloring matter, and cyanocinnamic acid nonlinear optical coloring matter).

Further, as the dyestuff or coloring matter, so-called "functional coloring matter" may be also used. The functional coloring matter is composed of carrier forming material and carrier moving material. The carrier forming material is, for example, perylene pigment, quinone pigment, squalilium coloring matter, azulenium coloring matter, thiapyrilium coloring matter, and bisazo pigment. The carrier moving material includes oxadiazole derivative, oxazole derivative, pyrazoline derivative, hydrozine derivative, aryl amine derivative, etc.

Content of the filler may be properly adjusted in consideration of extinction coefficient of base polymer or extinction coefficient of workpiece, and is usually about 5 parts by weight of 100 parts by weight of base polymer, or preferably about 3 parts by weight.

The base material may be made of a single layer or plural layers. It may be formed as membrane, mesh or other shape.

The thickness of base material may be properly adjusted within a range not spoiling the handling and working efficiency at each step of adhering to the workpiece, cutting or drilling of workpiece, and peeling and collecting of cut pieces, but usually it is about 500 µm or less, or preferably about 3 to 300 µm, or more preferably 5 to 250 µm. The surface of base material is treated by ordinary surface treatment for enhancing the contact with the adjacent material or retaining property, such as chromate treatment, ozone exposure, flame exposure, high voltage electric impact exposure, ionization radiation treatment, and other chemical or physical treatment.

Forming materials of adhesive layer include known adhesive materials including (meth)acrylic polymer and rubber polymer.

Monomer components for forming (meth)acrylic polymer are alkyl (meth)acrylates having alkyl radical of straight chain or branch chain with 30 carbon atoms or less, or preferably 4 to 18 carbon atoms, including, for example, methyl radical, ethyl radical, n-propyl radical, isopropyl radical, n-butyl radical, t-butyl radical, isobutyl radical, amyl radical, isoamyl radical, hexyl radical, heptyl radical, cyclohexyl radical, 2-ethyl hexyl radical, octyl radical, iso-octyl radical, nonyl radical, isononyl radical, decynol radical, isodecyl radical, undecyl radical, lauryl radical, tridecyl radical, tetradecyl radical, stearyl radical, octadecyl radical, and dodecyl radical. These alkyl (meth)acrylates may be used either alone or in combination of two or more types.

In order to modify the adhesiveness, coagulation or heat resistance of (meth)acrylic polymer, other monomer components than mentioned above may be copolymerized as required. Other monomers capable of forming such polymers include, for example, acrylic acid and methacrylic acid, carboxyethylacrylate and carboxypentylacrylate, itaconic acid and maleic acid, fumaric acid and crotonic acid or other monomer containing carboxyl radical, maleic anhydride and itaconic anhydride or other monomer of acid anhydride, (meth)acrylic acid 2-hydroxyl ethyl and (meth)acrylic acid 2-hydroxyl propyl, (meth)acrylic acid 4-hydroxyl butyl and (meth)acrylic acid 6-hydroxylhexyl, (meth)acrylic acid 8-hydroxyoctyl and (meth)acrylic acid 10-hydroxyl decyl, (meth) acrylic acid 12-hydroxylauryl and (4-hydroxymethyl cyclohexyl)-methylacrylate or other monomer containing hydroxyl radical, styrene sulfonic acid and allyl sulfonic acid, 2-(meth)acrylic amide-2-methyl propane sulfonic acid and (meth)acrylic amide propane sulfonic acid, sulfopropyl (meth)acrylate and (meth)acryloyl oxynaphthalene sulfonic acid or other monomer containing sulfonic acid radical, 2-hydroxy ethyl acryloyl phosphate or other monomer containing phosphoric acid radical, (meth)acrylic amide, (meth)acrylic acid N-hydroxymethyl amide, (meth)acrylic acid alkyl aminoalkyl ester (for example, dimethyl aminoethyl methacrylate), t-butyl aminoethyl methacrylate, etc.), N-vinyl pyrrolidone, acryloyl morphorine, vinyl acetate, styrene, acrylonitrile, etc. These monomer components may be used either alone or in combination of two or more types.

In addition, for the purpose of crosslinking of acrylic polymer or the like, multifunctional monomers and the like may be added as required as monomer component for copolymerization.

Examples of such monomer include hexane diol di(meth) acrylate and (poly)ethylene glycol di(meth)acrylate, (poly) propylene glycol di(meth)acrylate and neopentyl glycol di(meth)acrylate, pentaerythritol di(meth)acrylate and trimethylol propane tri(meth)acrylate, pentaerythritol hexatri (meth)acrylate and dipentaerythritol hexa(meth)acrylate, epoxy acrylate and polyester acrylate, urethane acrylate, and others. One type or two or more types of multifunctional monomer may be used.

The content of multifunctional monomer is preferred to be 30 wt % or less of the total monomer content from the viewpoint of adhesiveness and others, and more preferably 20 wt % or less.

To prepare (meth)acrylic polymer, various methods may be applied, for example, solution polymerization method of mixture containing one, two or more types of monomer components, emulsification polymerization method, block polymerization, and suspension polymerization method.

Polymerization initiator includes peroxides such as hydrogen peroxide, benzoyl peroxide, and t-butyl peroxide. It is preferred to use alone, but it may be combined with reducer to be used as redox polymerization initiator. The reducer includes sulfite, hydrogen sulfite, iron, copper, cobalt salt, or other ionized salt, triethanolamine and other amines, aldose, ketose, and other reducing sugar. An azo compound is also a preferred polymerization initiator, and its example includes 2,2'-azobis-2-methylpropio amidinate, 2,2'-azobis-2,4-dimethyl valeronitrile, 2,2'-azobis-N,N'-dimethylene isobutyl amidinate, 2,2'-azobis isobutyronitrile, and 2,2'-azobis-2-methyl-N-(2-hydroxy ethyl) propione amide. Two or more types of these polymerization initiators may be used in combination.

Reaction temperature is usually about 50 to 85° C., and the reaction time is about 1 to 8 hours. Among the manufacturing method, solution polymerization is preferred, and as solvent of (meth)acrylic polymer, generally, ethyl acetate, toluene, and other polar solvents are used. The solution concentration is generally about 20 to 80 wt %.

The adhesive agent may be properly combined with a crosslinking agent for raising the number-average molecular weight of (meth)acrylic polymer used as base polymer. Examples of crosslinking agent include polyisocyanate compound, epoxy compound, aziridine compound, melamione resin, urea resin, anhydrous compound, polyamine, and polymer containing carboxyl radical. When the crosslinking agent is used, its content must be determined so that the peel adhesive strength may not be lowered too much, and generally it is preferred to add by about 0.01 to 5 parts by weight in 100 parts by weight of base polymer. The adhesive agent for forming the adhesive layer may be also combined with other known additives as required, in addition to the specified components, such as adhesion improver, aging retardant, filler, coloring matter, and others.

To improve peeling from workpiece, the adhesive agent is preferred to be radiation curing type adhesive which is cured by radiation such as ultraviolet ray or electron ray. When a radiation curing type adhesive is used as the adhesive agent, since the adhesive layer is irradiated with radiation after laser processing, the base material is preferred to have a sufficient radiation transmissivity.

The radiation curing type adhesive includes, for example, radiation curing type adhesive prepared by blending radiation curing monomer component or oligomer component to the (meth)acrylic polymer.

Examples of monomer component or oligomer component of radiation curing type to be blended include urethane; (meth)acrylate oligomer, trimethylol propane tri(meth)acrylate, tetramethylol methane tetra(meth)acrylate, tetraethylene glycol di(meth)acrylate, pentaerythritol tri(meth)acrylate, pentaerythritol tetra(meth)acrylate, dipentaerythritol monohydroxy penta(meth)acrylate, dipentaerythritol hexa(meth)acrylate, 1,4-butylene glycol di(meth)acrylate, 1,6-hexane diol (meth)acrylate, and other ester compounds of (meth)acrylate and polyhydric alcohol; 2-propenyl-3-butenyl cyanurate, tris(2-methacryloxy ethyl) isocyanurate, and other isocyanurate or isocyanurate compounds. One type or two or more types of monomer component or oligomer component may be used.

The blending amount of radiation curing monomer component or oligomer component is not particularly specified, but considering the adhesiveness, it is preferred to add by about 5 to 500 parts by weight in 100 parts by weight of base polymer such as (meth)acrylic polymer for composing the adhesive agent, and more preferably by about 70 to 150 parts by weight.

As the radiation curing type adhesive, further, a base polymer having carbon-carbon double bond in the polymer side chain, main chain or main chain end may be used. Such base polymer is preferred to have (meth)acrylic polymer as basic skeleton. In this case, radiation curing type monomer component or oligomer component may not be added, and its use is free.

The radiation curing type adhesive should contain a photopolymerization initiator when curing by ultraviolet ray or the like. Examples of photopolymerization initiator include 4-(2-hydroxy ethoxy)phenyl (2-hydroxy-2-propyl)ketone, alpha-hydroxy-alpha, alpha-methyl acetophenone, methoxy acetophenone, 2,2-dimethoxy-2-2-saphenyl acetophenone, 2,2-diethoxy acetophenone, 1-hydroxy siurohexyl phenyl ketone, 2-methyl-1-(4-(methylthio)-phenylco-2-morpholinopropane-1, other acetophenone compounds, benzoin ethyl ether, benzoin isopropylether, anizoin methyl ether, other benzoin ether compounds, 2-methyl-2-hydroxypropiophenone, other alpha-ketol compounds, benzyl dimethyl ketal, other ketal compounds, 2-naphthalene sulfonyl chloride, other aromatic sulfonyl chloride compounds, 1-phenone-1,1-propane dione-2-(O-ethoxy carbonyl) oxime, other photoactive oxime compounds, benzophenone and benzoyl benzoic acid, 3,3-dimethyl-4-methoxybenzophenone, other benzophenone compounds, thioxanthone, 2-chlorothioxanthone, 2-methl thioxanthone, 2,4-dimethyl thioxanthone, isopropyl thioxanthone, 2,4-dichlorothoixanthone, 2,4-diethyl thioxanthone, 2,4-diisopropyl thioxanthone, other thioxanthone compounds, and also camphor quinone, ketone halide, acyl phosphino oxide, acyl phosphonate, etc.

The content of photopolymerization initiator is preferred to be about 0.1 to 10 parts by weight in 100 parts by weight of base polymer such as (meth)acrylic polymer for composing the adhesive agent, or more preferably about 0.5 to 5 parts by weight.

The protective sheet can be manufactured by applying an adhesive solution on the surface of a base material, and drying (or heating and crosslinking as required) to form an adhesive layer. Alternatively, an adhesive layer may be separately formed on a peeling liner, and it may be adhered to the base material. The adhesive layer may one layer or two or more layers. As required, a separator may be formed on the surface of the adhesive layer.

The adhesive layer is preferred to be low in content of low molecular substance from the viewpoint of prevention of contamination on workpiece. From such point of view, the number-average molecular weight of (meth)acrylic polymer is preferred to be 500,000 or more, more preferably 800,000 to 3,000,000.

The thickness of adhesive layer may be properly selected within a range not peeling from the workpiece, and is preferred to be about 5 to 300 μm, more preferably about 10 to 100 μm, and further preferably about 10 to 50 μm.

The adhesive strength of adhesive layer is preferred to be 20 N/20 mm or less on the basis of adhesive strength (90-degree peel value, peeling speed 300 mm/min) at ordinary temperature (before laser emission) on SUS304, and more preferably 0.001 to 10 N/20 mm, or further preferably 0.01 to 8 N/20 mm.

The separator is used as required for protecting label processing or adhesive layer. The material for the separator includes paper, polyethylene, polypropylene, polyethylene terephthalate, and other synthetic resin film. The surface of the separator may be properly treated for improving the peeling performance from the adhesive layer by, for example, silicone treatment, long-chain alkyl treatment, fluorine treatment or other peeling treatment. As required, further, ultraviolet transmission preventive treatment may be applied to prevent the protective sheet from reacting by environmental ultraviolet rays. The thickness of the separator is usually 10 to 200 μm, preferably about 25 to 100 μm.

Figure 3:
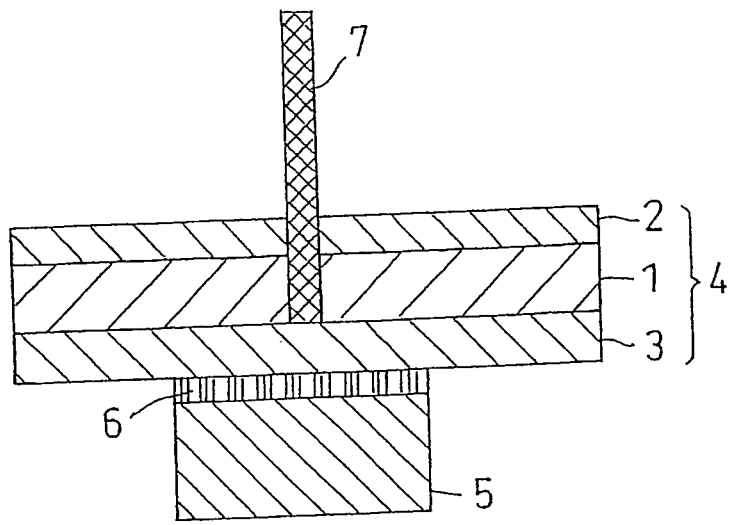
FIG. 3 is a schematic diagram showing a section of a laminated body processed by ultraviolet absorption ablation of laser beam.

The following explains a method of manufacturing a laser processed part by optical absorption ablation of laser beam by using a protective sheet of which extinction coefficient ratio is 1 or more (protective sheet of which extinction coefficient at wavelength 532 nm is 20 cm$^{-1}$ or more). For example, in the case of cutting process, as shown in FIG. 1 and FIG. 3, a protective sheet 2, a workpiece (or metal workpiece) 1, and an adhesive sheet 3 are glued together by known means such as roll laminator and press to obtain a laminated body 4 of protective sheet, workpiece and adhesive sheet, which is disposed on an adsorption plate 6 of an adsorption stage 5, and a laser beam 7 is emitted to the laminated body 4 from a specified laser oscillator by focusing and emitting on the protective sheet 2 by means of a lens, and the laser emission position is moved along the specified processing line to cut the workpiece. The adhesive sheet 3 disposed at the exit side of laser beam of the workpiece plays the role of supporting and fixing the workpiece before laser processing, and plays the role of preventing the cut piece from falling after laser processing, and a sheet of low laser processability is used. As the adhesive sheet 3, a general material having an adhesive layer laminated on a base material may be used without particular limitation.

Laser beam moving means includes galvano scan, X-Y stage scan, mask image processing, and other known laser processing method.

The laser processing condition is not particularly specified as far as the protective sheet 2 and workpiece 1 can be cut off completely, but in order to prevent cutting of adhesive sheet 3, it is preferred to control within 2 times of energy condition for cutting the workpiece 1.

The cutting allowance (section groove) can be narrowed by reducing the beam diameter of focusing unit of laser beam, but in order to enhance the section end precision, it is preferred to satisfy the condition of beam diameter (μm)>2× (laser beam moving speed (μm/sec)/laser beam repetition frequency (Hz)).

Figure 2:
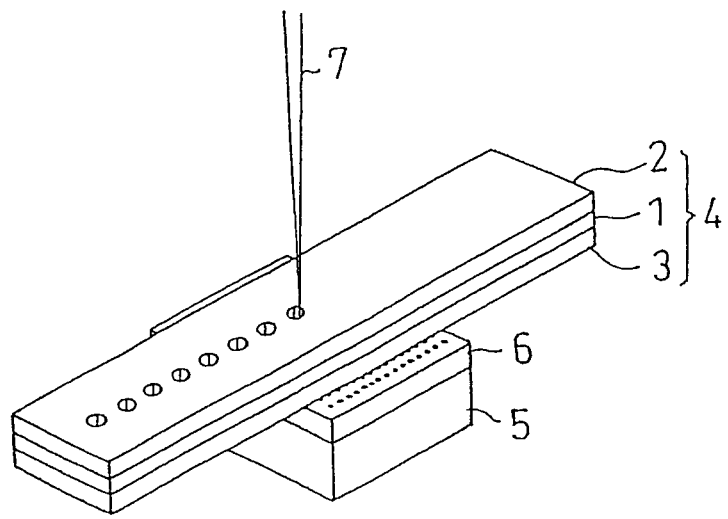
FIG. 2 is a schematic process diagram showing other example of manufacturing method of laser processed parts according to the invention.
Figure 2:
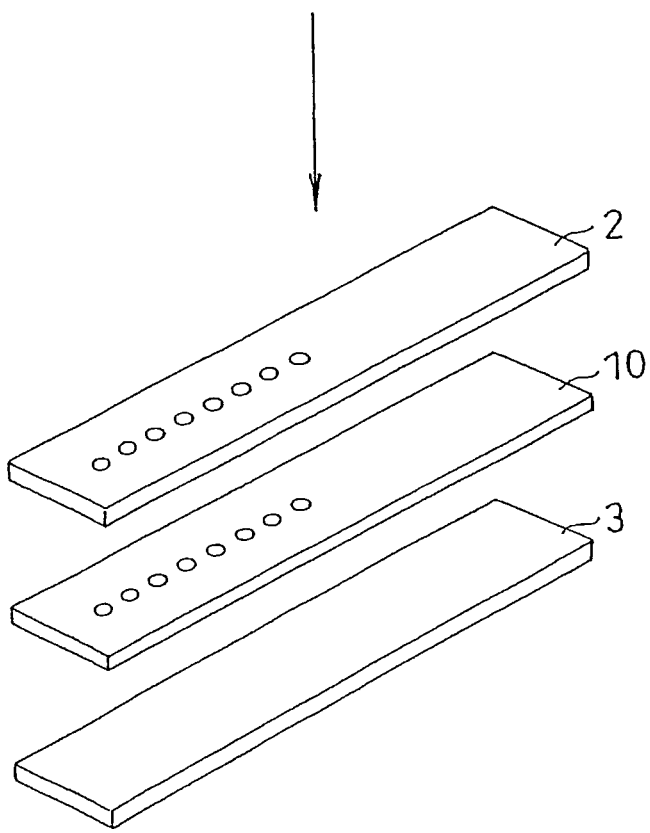

In the case of drilling, as shown in FIG. 2, a protective sheet 2, a workpiece 1, and an adhesive sheet 3 are glued together by known means such as roll laminator and press to obtain a laminated body 4 of protective sheet, workpiece and adhesive sheet, which is disposed on an adsorption plate 6 of an adsorption stage 5, and a laser beam 7 is emitted to the laminated body 4 from a specified laser oscillator by focusing and emitting on the protective sheet 2 by means of a lens, and a hole is formed.

The hole is formed by known laser processing method such as punching by galvano scan, X-Y stage scan, mask imaging. The laser processing condition may be determined at the optimum value on the basis of the ablation threshold of workpiece. To prevent drilling of adhesive sheet 3, it is preferred to control within 2 times of energy condition for drilling the workpiece 1.

Decomposition products can be scattered and removed efficiently by blowing gas of helium, nitrogen or oxygen to the laser processing unit.

Figure 4:
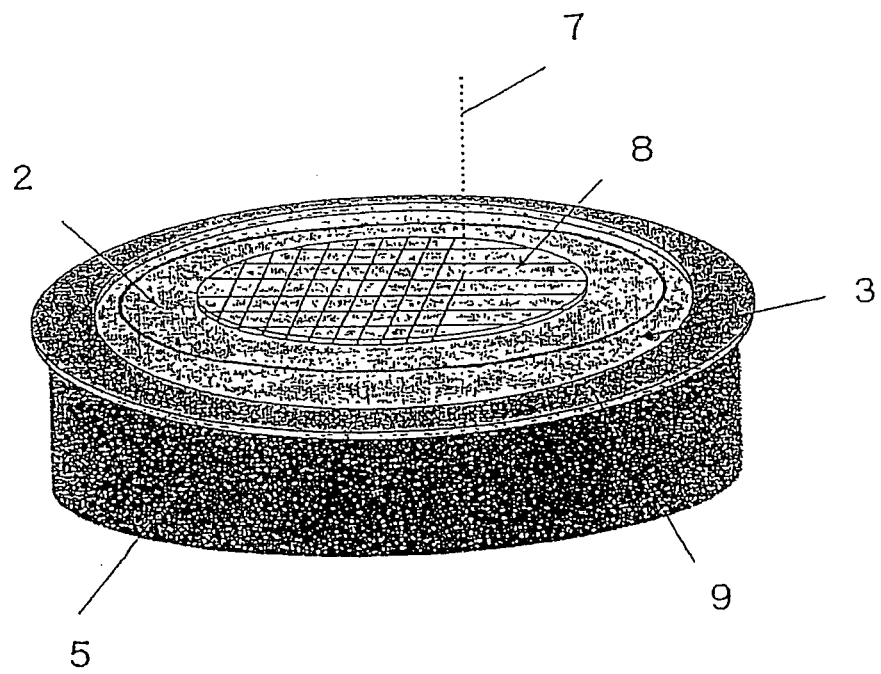
FIG. 4 is a schematic diagram showing an example of dicing method of semiconductor wafer.

In cutting process of semiconductor wafer, as shown in FIG. 4, one side of a semiconductor wafer 8 is adhered to an adhesive sheet 3 disposed on an adsorption stage 5, a protective sheet 2 is disposed at other side, and a laser beam 7 generated from a specified laser oscillator is focused and emitted to the protective sheet 2 by a lens, and the laser emission position is moved along the specified processing line, so that it is cut off. Laser beam moving means includes galvano scan, X-Y stage scan, mask image processing, and other known laser processing method. The laser processing condition is not particularly specified as far as the protective sheet 2 and semiconductor wafer 8 can be cut off completely, while the adhesive sheet 3 is not cut off.

In such cutting process of semiconductor wafer, after cutting into individual semiconductor chips, the individual semiconductor chips can be picked up and collected by known methods such as the method of picking up by using a poking pin called needle by a conventional die bonder or other device, or a method disclosed in Japanese Laid-open Patent No. 2001-118862.

In the manufacturing method of laser processed parts of the invention, after laser processing, the protective sheet 2 is peeled off from the laser processed part 10. The peeling method is not particularly specified, but it is important not to apply stress to cause permanent set of laser processed part 10 at the time of peeling. For example, when radiation curing type adhesive is used in the adhesive layer, the adhesiveness is lowered by curing the adhesive layer by radiation irradiation depending on the type of adhesive agent. By irradiation with radiation, the adhesiveness of the adhesive layer is lowered by curing, and it is easier to peel off. Irradiation means of radiation is not particularly specified, and, for example, ultraviolet radiation may be used.

In the manufacturing method of laser processed part of the present invention, by using a protective sheet of which extinction coefficient ratio is 1 or more (protective sheet of which extinction coefficient at wavelength 532 nm is 20 cm$^{-1}$ or more), the protective sheet is more likely to be etched than the workpiece (or metal material), and the workpiece (or metal material) of lower layer is etched after the laser illuminated portion of protective sheet is etched sufficiently. Accordingly, the decomposition product of workpiece (or metal material) efficiently scatters outside from the etching portion of protective sheet, and contamination of interface area of protective sheet and workpiece (or metal material) can be suppressed. Therefore, according to this manufacturing method, decomposition product does not stick to the interface area of protective sheet and workpiece (or metal material), and the protective sheet can be easily separated from the workpiece after laser processing of workpiece (or metal material), and laser processing precision of workpiece (or metal material) can be enhanced.

EXAMPLES

Exemplary embodiments of the invention are described specifically below, but it must be noted that the invention is not limited by these embodiments alone.

[Measurement of Number-Average Molecular Weight]

Number-average molecular weight of synthesized (meth) acrylic polymer was measured in the following method. By dissolving the synthesized (meth)acrylic polymer in THF at 0.1 wt %, the number-average molecular weight was calculated by polystyrene conversion by using GPC (gel permeation chromatography). The measuring condition is as follows.

GPC apparatus: HLC-8210GPC of Tosoh corporation
Column: (GMHHR-H)+(GMHHR-H)+(G2000HHR) of Tosoh corporation
Flow rate: 0.8 ml/min
Concentration: 0.1 wt %
Injection: 100 μl
Column temperature: 40° C.
Eluate: THF

[Measurement of Extinction Coefficient]

To determine the extinction coefficient of protective sheet and workpiece, absorbance at wavelength 532 nm was measured by using spectrophotometer (U-3410 manufactured by Hitachi Ltd., and it was calculated from the absorbance.

Example 1

As workpiece, triacetyl cellulose sheet (thickness 80 μm, extinction coefficient 11 cm$^{-1}$) was used. On a cellophane film (thickness 20 μm), ultraviolet curable acrylic adhesive solution (1) was applied and dried, and an adhesive layer (thickness 10 μm) was formed, and a protective sheet (extinction coefficient 37 cm$^{-1}$) was manufactured. Extinction coefficient ratio was 3.4.

The acrylic adhesive solution (1) was prepared in the following method. In 650 parts by weight of toluene, 100 parts by weight of acrylic polymer of number-average molecular weight of 800,000 prepared by copolymerization of butyl acrylate/ethyl acrylate/2-hydroxy ethyl acrylate/acrylic acid at ratio by weight of 60/40/4/1, 90 parts by weight of dipentaerythritol monohydroxy pentacrylate as photopolymerizable compound, 5 parts by weight of benzyl dimethyl ketal (Irgacure 651) as photopolymerization initiator, and 2 parts by weight of polyisocyanate type cross-linking agent (Coronate L manufactured by Nippon Polyurethane Co.) were added, and dissolved and mixed uniformly, and acrylic adhesive solution (1) was prepared.

The manufactured protective sheet was adhered to one side of the triacetyl cellulose sheet by means of a roll laminator, and a triacetyl cellulose sheet with protective sheet was fabricated.

On an XY stage mounting glass epoxy resin adsorption board, the triacetyl cellulose sheet with protective sheet was disposed with the protective sheet upside. Nd:YAG laser second harmonic of wavelength 532 nm, average output 5 W, and repetition frequency of 70 kHz was focused on the surface of triacetyl cellulose with protective sheet in a diameter of 60 μm by fθ lens, and laser beam was scanned at speed of 20 mm/second by galvanoscanner to cut off. At this time, it was confirmed that protective sheet and triacetyl cellulose sheet were cut off. By emitting ultraviolet ray to protective sheet, the adhesive layer was cured. The protective sheet was peeled off, and the laser processing peripheral area of protective sheet adhering surface (laser beam incident side) of triacetyl cellulose sheet was observed, but decomposition product (deposit) was not observed.

Comparative Example 1

Triacetyl cellulose sheet was processed by laser in the same procedure as in example 1, except that the protective sheet was not disposed at one side of triacetyl cellulose sheet. Peripheral area of processing at the laser incident side of triacetyl cellulose sheet was observed, and lots of deposits of scattered decomposition residue were observed.

Comparative Example 2

Triacetyl cellulose sheet was processed by laser in the same procedure as in example 1, except that a base material (thickness 70 μm) of methyl polymethacrylate was used instead of cellophane film. Extinction coefficient of protective sheet was 1.7 cm$^{-1}$. Extinction coefficient ratio was 0.15. As a result, the protective sheet was not cut off, and the triacetyl cellulose sheet of lower layer was processed by laser, and foams containing decomposition residues were generated between the protective sheet and triacetyl cellulose sheet. The adhesive layer was cured by emitting ultraviolet ray to protective sheet. The protective sheet was peeled off, and the area around the opening of laser incident side of triacetyl cellulose was observed, and lots of deposits of scattered decomposition residue of triacetyl cellulose were observed.

Example 2

Polypropylene sheet (thickness 100 μm, extinction coefficient 15.9 cm$^{-1}$) was used as workpiece. Polypropylene sheet with protective sheet was manufactured in the same procedure as in example 1, except that polyimide film (thickness 25 μm) was used as base material of protective sheet instead of cellophane film. The extinction coefficient of protective sheet was 54.6 cm$^{-1}$. Extinction coefficient ratio was 3.4.

On a film (thickness 25 μm) of ethylene-vinyl acetate copolymer, acrylic adhesive solution (1) was applied and dried, and an adhesive layer (thickness 10 μm) was formed, and an adhesive sheet was manufactured. The adhesive sheet was glued to the back side of the polypropylene sheet with protective sheet, and polypropylene sheet with protective and adhesive sheet was manufactured. By cutting and processing in the same manner as in example 1, the protective sheet and polypropylene sheet were cut off, but the adhesive sheet was not cut off. By emitting infrared ray to the protective sheet, the adhesive layer was cured. The protective sheet was peeled off, and the laser processing peripheral area of protective sheet adhering surface (laser beam incident side) of polypropylene sheet was observed, but decomposition product (deposit) was not observed.

Example 3

Silicon wafer (thickness 100 μm) was used as material to be processed. Silicon wafer with protective sheet was manufactured in the same procedure as in example 1, except that polyethylene naphthalate (thickness 50 μm) was used as base material of protective sheet instead of cellophane film. The extinction coefficient of protective sheet was 76.3 cm$^{-1}$.

On a film (thickness 100 μm) of polyethylene, acrylic adhesive solution (1) was applied and dried, and an adhesive layer (thickness 10 μm) was formed, and an adhesive sheet was manufactured. The adhesive sheet was glued to the back side of the silicon wafer with protective sheet, and silicon wafer with protective and adhesive sheet was manufactured. By cutting and processing in the same manner as in example 1, the protective sheet and silicon wafer were cut off, but the adhesive sheet was not cut off. By emitting infrared ray to the protective sheet, the adhesive layer was cured. The protective sheet was peeled off, and the laser processing peripheral area of protective sheet adhering surface (laser beam incident side) of silicon wafer was observed, but decomposition product (deposit) was not observed.

As clear from the examples and comparative examples, by using protective sheet of which extinction coefficient ratio is 1 or more, contamination of workpiece surface by decomposition product can be effectively suppressed. When processing a metal material, by using a protective sheet of which extinction coefficient is 20 cm$^{-1}$ or more, contamination of metal material surface by decomposition product can be effective suppressed. As a result, the subsequent process of removal of decomposition product can be substantially simplified, and hence it contributes not only to reduction of environmental impact, but also to enhancement of productivity.

What is claimed is:

1. A method of manufacturing a laser processed part, comprising:

providing a workpiece to be processed;

providing a protective sheet for laser processing, wherein the protective sheet includes at least a base material and an adhesive layer on the base material, and wherein the protective sheet is characterized as having an extinction coefficient ratio of 1 or more, where the extinction coefficient ratio is defined as an extinction coefficient of the protective sheet at wavelength 532 nm divided by an extinction coefficient of the workpiece at wavelength 532 nm;

adhering the adhesive layer of the protective sheet for laser processing to a laser beam incident side of the workpiece;

processing the protective sheet for laser processing and the workpiece by irradiating a laser beam, thereby suppressing contamination of the workpiece by decomposition product; and removing the protective sheet for laser processing from the processed workpiece.

2. The method of manufacturing a laser processed part according to claim 1, wherein the workpiece is one of a sheet material, a circuit board, a semiconductor wafer, a glass substrate, a ceramic substrate, a metal substrate, a semiconductor laser light emitting or receiving element substrate, an MEMS substrate, and a semiconductor package.

3. The method of manufacturing a laser processed part according to claim 1, wherein the base material contains an aromatic polymer.

4. The method of manufacturing a laser processed part according to claim 1, wherein the processing is cutting or drilling.

5. The method according to claim 1, wherein the protective sheet comprises a filler added to the base material such that an extinction coefficient of the base material at a wavelength of 532 nm is increased.

6. The method according to claim 1, wherein the laser beam has a wavelength of 532 nm.

7. The method according to claim 1, wherein the method of manufacturing is a method processed by a laser-light-absorbing ablation.

8. The method according to claim 1, wherein the base material is a cellulose or a silicon series rubber.

9. The method according to claim 1, further comprising adhering an adhesive sheet on the non-laser beam incident side of the workpiece prior to processing with the laser beam.

10. The method according to claim 1, wherein the irradiating a laser beam is at a power output within 2 times of the power output sufficient for cutting the workpiece.

11. The method according to claim 1, wherein the irradiating a laser beam is at a power output sufficient for cutting the workpiece.

12. A method of manufacturing a laser processed part, comprising:

providing a workpiece to be processed;

providing a protective sheet for laser processing, wherein the protective sheet includes at least a base material and an adhesive layer on the base material, and wherein the protective sheet is characterized as having an extinction coefficient at wavelength 532 nm of 20 cm$^{-1}$ or more;

adhering the adhesive layer of the protective sheet for laser processing to a laser beam incident side of a metal material;

processing the protective sheet for laser processing and the metal material by irradiating a laser beam, thereby suppressing contamination of the workpiece by decomposition product; and removing the protective sheet for laser processing from the processed metal material.

13. The method of manufacturing a laser processed part according to claim 12, wherein the metal material is a semiconductor wafer or a metal substrate.

14. The method of manufacturing a laser processed part according to claim 12, wherein the base material contains an aromatic polymer.

15. The method of manufacturing a laser processed part according to claim 12, wherein the processing is cutting or drilling.

16. The method according to claim 12, wherein the protective sheet comprises an acrylic adhesive layer on a base material made of polyethylene film.

17. The method according to claim 12, wherein the protective sheet comprises a filler added to the base material such that an extinction coefficient of the base material at a wavelength of 532 nm is increased.

18. The method according to claim 12, wherein the laser beam has a wavelength of 532 nm.

19. The method according to claim 12, wherein the method of manufacturing is a method processed by a laser-light-absorbing ablation.

20. The method according to claim 12, wherein the base material is a cellulose or a silicon rubber.

21. The method according to claim 12, further comprising adhering an adhesive sheet on the non-laser beam incident side of the workpiece prior to processing with the laser beam.

22. The method according to claim 12, wherein the irradiating a laser beam is at a power output within 2 times of the power output sufficient for cutting the workpiece.

23. The method according to claim 12, wherein the irradiating a laser beam is at a power output sufficient for cutting the workpiece.

24. A method of manufacturing a laser processed part, comprising:

providing a workpiece-to-be-processed;

providing a protective sheet comprising a base material and an adhesive layer formed thereon, said protective sheet having an extinction coefficient ratio of 1 or more which is defined as an extinction coefficient of the protective sheet at a wavelength of 532 nm divided by an extinction coefficient of the workpiece-to-be-processed at a wavelength of 532 nm;

adhering the adhesive layer of the protective sheet to a laser beam incident side of the workpiece-to-be-processed;

processing the protective sheet and the workpiece-to-be-processed by irradiating a laser beam to obtain a processed workpiece, thereby suppressing contamination of the workpiece by decomposition product; and removing the protective sheet from the processed workpiece.

25. The method according to claim 24, wherein the workpiece-to-be-processed is selected from the group consisting of a sheet material, a circuit board, a semiconductor wafer, a glass substrate, a ceramic substrate, a metal substrate, a semiconductor laser light emitting or receiving element substrate, an MEMS substrate, and a semiconductor package.

26. The method according to claim 24, wherein the base material of the protective sheet contains an aromatic polymer.

27. The method according to claim 24, wherein the processing step comprises cutting or drilling.

28. A method of manufacturing a laser processed part, comprising:
- providing a workpiece to be processed;
- providing a protective sheet comprising a base material and an adhesive layer formed thereon, said protective sheet having an extinction coefficient at a wavelength of 532 nm of 20 $cm^{-1}$ or more;
- adhering the adhesive layer of the protective sheet to a laser beam incident side of a metal material-to-be-processed;
- processing the protective sheet and the metal material-to-be-processed by irradiating a laser beam to obtain a processed material, thereby suppressing contamination of the workpiece by decomposition product; and
- removing the protective sheet from the processed metal material.

29. The method according to claim 28, wherein the metal material-to-be-processed is a semiconductor wafer or a metal substrate.

30. The method according to claim 28, wherein the base material of the protective sheet contains an aromatic polymer.

31. The method according to claim 28, wherein the processing step comprises cutting or drilling.

* * * * *